United States Patent
Jarvis et al.

(10) Patent No.: US 6,362,634 B1
(45) Date of Patent: Mar. 26, 2002

(54) INTEGRATED DEFECT MONITOR STRUCTURES FOR CONDUCTIVE FEATURES ON A SEMICONDUCTOR TOPOGRAPHY AND METHOD OF USE

(75) Inventors: Richard W. Jarvis; Michael G. McIntyre, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/483,556

(22) Filed: Jan. 14, 2000

(51) Int. Cl.[7] .............................................. G01R 31/28
(52) U.S. Cl. ....................................... 324/719; 324/765
(58) Field of Search ................................ 324/765, 719, 324/722, 766, 133, 537

(56) References Cited

U.S. PATENT DOCUMENTS

| | | |
|---|---|---|
| 4,801,869 A | 1/1989 | Sprogis |
| 5,751,015 A | 5/1998 | Corbett et al. |
| 5,872,018 A | 2/1999 | Lee |
| 5,874,318 A | 2/1999 | Baker et al. |

*Primary Examiner*—Safet Metjahic
*Assistant Examiner*—Vincent Q. Nguyen
(74) *Attorney, Agent, or Firm*—Kevin L. Daffer; Conley, Rose & Tayon P.C.

(57) ABSTRACT

A test structure which includes a first conductive feature layer and a second conductive feature layer is described. The first conductive feature layer includes a first conductive line. The second conductive feature layer includes a second conductive line. A daisy chain conductive feature is also included in the test structure. The daisy chain conductive feature includes portions on the first and second conductive feature layers which are interconnected to each other by vias.

22 Claims, 11 Drawing Sheets

INTEGRATED DEFECT MONITOR STRUCTURES FOR CONDUCTIVE FEATURES ON A SEMICONDUCTOR TOPOGRAPHY AND METHOD OF USE

BACKGROUND OF THE INVENTION

1. Field of the Invention

This invention relates to semiconductor fabrication and more particularly to a test structure for testing the accuracy at which conductive structures are formed.

2. Description of the Relevant Art

High yields are essential to the profitable manufacture of integrated circuits. Inspection technologies that detect fatal manufacturing defects immediately after critical processing is accordingly a very valuable tool in assuring that such manufacture will be economically successful.

A wafer fabrication process typically forms multiple integrated circuits upon each of several silicon wafers processed simultaneously. As the integrated circuits formed on a given silicon wafer are identical copies of a given product, the silicon wafer is sometimes referred to as a product wafer. An individual integrated circuit is also called a "chip" or a "die". Following wafer fabrication, the die are subjected to functional testing, then separated. Fully functional die are typically packaged and sold as individual units.

In general, the yield associated with a product wafer manufactured using a particular wafer fabrication process depends upon: 1) the number of steps in the wafer fabrication process, 2) the number of defects introduced during each processing step, and 3) the vulnerability of the features formed during a given processing step to the defects introduced during the processing step.

A defect is simply a flaw caused by an imperfect manufacturing process. Only some of the defects associated with a given step are "catastrophic" defects, or defects which prevent an integrated circuit containing the defect from performing its intended function. It is well known that most defects occur during microstructure patterning steps. Photolithography is used to accomplish such patterning steps, during which light passing through a pattern on a mask transfers the pattern to a layer of a light-sensitive material deposited on the surface of a silicon wafer. The layer of the light-sensitive material is developed in a manner analogous to the developing of exposed photographic film. Exposure to light makes certain regions of the layer of light-sensitive material soluble. The developing step removes the soluble regions, forming holes in the layer of light-sensitive material. Select regions of the upper surface of an etchant or to dopant atoms through the holes during a subsequent processing step. Small particles (i.e., particulates) on the surface of the mask or on the surface of the photoresist layer, which block or diffuse light, cause imperfect pattern registrations (i.e., imperfect feature formations). Particulates may be present in the ambient air, introduced by processing personnel, suspended in liquids and gases used during processing, or generated by processing equipment. In general, the vulnerability of a particular feature to a given defect is inversely proportional to the physical dimensions of the feature. Thus the smaller the physical dimensions of a feature formed using photolithography, the greater the likelihood that a particulate of a given size will cause a catastrophic defect.

There are a variety of types of defects which may occur when conductive layers are formed on an integrated circuit topography. Extra material defects ("EMDs") may occur when the conductive structures include material extending beyond the predefined boundaries. Such material may extend to another conductive structure causing a "short" to be formed between the two conductive structures. Missing material defects ("MMDs") may occur when a conductive structure is formed which is missing some of its conductive material. Such a defect may cause the formation of an "open" conductive structure in which the continuity of a conductive structure is broken. In addition, when forming multiple layers of conductive layers, stacked upon each other, other problems may arise. The multiple conductive layers are typically separated from each other by a dielectric (i.e., non-conductive) layer. A breakdown in the formation of this interlevel dielectric layer may allow a short to be formed between the staked conductive structures. Furthermore, conductive features on different conductive layers are typically interconnected by inter-level vertical contacts (i.e., vias). If these vias are misaligned during the processing of the conductive features, the vias may miss one or more of the conductive features it was intended to connect. Many of these defects may be tested using test structures. For example, EMDs and MMDs may be detected using specially designed test structures. Typically, these test structures include a number of electrically testable conductive lines. Electrical probing of these conductive lines may be used to determine the presence of shorts between two or more conductive lines or the presence of opens in a conductive line. FIG. 1A depicts a typical test structure used to test for EMDs. The test structure includes a first conductive comb 10 with a test pad 12 and a second conductive comb 20 with a test pad 22. The combs are formed in close proximity to each other. If no EMDs are present, electrical probing of pads 12 and 22 will show no electrical connection (e.g., high resistance). If, however, a conductive EMD 30 having a sufficient size to bridge at least two of the conductive lines is present, as depicted in FIG. 1B, a short may be formed between the two conductive lines, thus allowing an electrical connection to be formed. When pads 12 and 22 are simultaneously probed an electrical connection (e.g., a low resistance) may be detected.

FIG. 2A depicts a serpentine structure which may be used to test for MMDs in a conductive structure. The test structure includes a serpentine conductive line 40 with test pads 42 and 44 formed at both ends of the line. If no MMDs are present, electrical probing of pads 42 and 44 should show conductivity between the two pads. If, however, an MMD 50 is present, as depicted in FIG. 2B, sufficient material may be absent such that the connectivity of the conductive line is broken. This MMD may be detected when electrical probing of the pads reveals a decrease in conductivity between the pads.

A disadvantage of these types of test structures is that they are typically capable of testing for only one type of defect at a time. For example, the test structure of FIG. 1 may only be used to detect MMDs. If one or more types of defect monitoring are to be performed, typically a variety of test structures are formed on the integrated circuit topography. Since each of these test structures takes up a portion of the wafer, and since the amount of space which may be allotted to forming test structures on a wafer may be limited, the number of test structures which may be used for each type of test may also be limited. This strategy may only have limited success since a defect may occur on a test structure which was not designed to detect the presence of that defect. For example, an EMD formed on a test structure designed to detect MMD may not be detected. It would be desirable to develop a test structure and method which may rapidly determine the presence of a variety of defects, rather than a single type of defect. Such a structure and method would be beneficial in rapidly detecting the presence of unacceptable defects during production.

SUMMARY OF THE INVENTION

The problems outlined above are in large part solved by a test structure which includes a daisy chain conductive feature and conductive lines formed at two conductive feature layers, the conductive layers being separated by a dielectric layer. Portions of the daisy chain conductive feature are positioned on the first and second conductive feature layers. These portions of the daisy chain conductive feature are interconnected by vias formed through the dielectric layer. Each of the first and second conductive feature layers may also include at least one conductive line. The conductive lines of the first and second conductive feature layers and the daisy chain conductive feature may be electrically isolated from each other. This test structure allows a variety of defects to be detected using a single test structure.

In one embodiment, a multi-layer test structure includes at least a first conductive line formed at a first conductive feature layer, a second conductive line formed at a second conductive feature layer, and a daisy chain conductive feature. A daisy chain conductive feature is herein defined as a conductive feature which includes segments of conductive lines which are formed on two conductive feature layers, the conductive line segments being electrically isolated from each other at each of the conductive feature layers. The conductive line segments may be interconnected by a series of inter-level (vertical) contacts (i.e., vias) formed between the two conductive layers.

The widths of the conductive lines, as well as the spacing between them, are preferably selected to correspond to the linewidths and separation between conductive lines that may be formed in production regions of a wafer. As used in this application, "production region" describes a region of a wafer that is designed to be a part of an operable integrated circuit intended to function as part of an electronic device targeted for use by a user of the die. Typically, the conductive lines have the minimum linewidth and spacing that will be used during a typical semiconductor processing step. Some of the conductive lines may also be formed having a variable width. Forming conductive lines having a variable width may more accurately approximate actual production features. The conductive lines may be formed by a deposition/etching procedure. Conductive lines formed from a deposition/etch may be formed from a conductive metal, e.g., aluminum, titanium, or silicided polysilicon. Alternatively, the conductive lines may be formed using a damascene process in which the conductive material is electrodeposited into a predefined trench. Conductive lines formed in this manner include copper, aluminum, tungsten or molybdenum.

A number of test pads may be coupled to the first, second and daisy chain conductive features. These test pads are configured to receive an electrical probe. An electrical probe may be used to apply a voltage to one or more test pads to determine the electrical connectivity of the various conductive features of the test structure. These test pads may also be used during voltage contrast inspection techniques.

The test structure may be used to test for defects which may have occurred during the formation of conductive features on an integrated circuit topography. The test structure may be formed on a test area of an integrated circuit topography using the same process steps as used on a production die area of the wafer. In this manner, process induced defects produced in the production die areas may be duplicated in the test structure area. Examples of test methods with which the above-described test structure may be used include, but are not limited to, voltage contrast inspection, optical inspection, and particle size distribution testing.

In another embodiment, a multi-layer test structure includes a first and third conductive line formed in a first conductive feature layer, a second and fourth conductive line formed in a second conductive feature layer, and a daisy chain conductive feature formed in both the first and second conductive layers. The addition of more conductive lines gives the test structure a higher density of conductive lines. High density test structures may be more sensitive to the presence of defects than lower density test structures.

In another embodiment, the test structure may be used to determine the approximate size range of a defect. The presence of an EMD may be detected during the electrical testing of the test structure. The conductive lines may be formed at a predetermined spacing from each other and have a predetermined width. After an EMD is detected, the test structure may be electrically tested to determine the possible size range of the defect. By determining which of the conductive lines are spanned by the defect, an approximate size range of the defect may be determined.

An advantage of the above described test structures is that a number of types of defects may be detected using a single test structure. In one embodiment, the test structures may be placed at predetermined locations of a production wafer, intermixed with production dies, to test for defects formed during the processing of production dies. Alternatively, an entire wafer may be dedicated to testing for defects during a manufacturing process. The wafer may include a plurality of test structures, as described above. The density and location of defects which may be formed during the manufacturing process may be detected before the production wafer is subjected to the processing conditions.

BRIEF DESCRIPTION OF THE DRAWINGS

Other objects and advantages of the invention will become apparent upon reading the following detailed description and upon reference to the accompanying drawings in which.

Figure 1A:
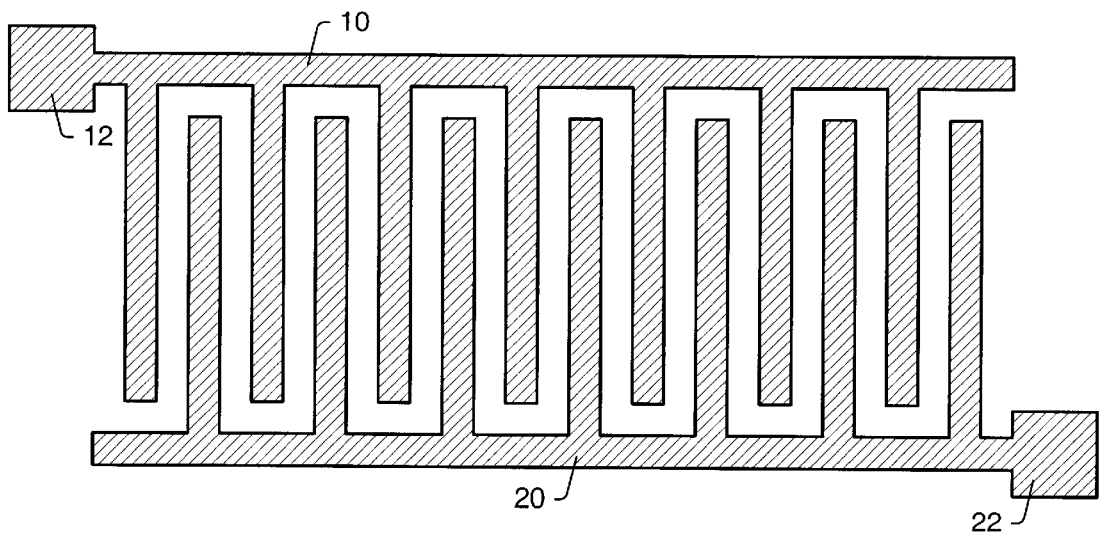
FIGS. 1A and 1B depict a top view of a prior art test structure for determining the presence of EMDs.
Figure 1B:
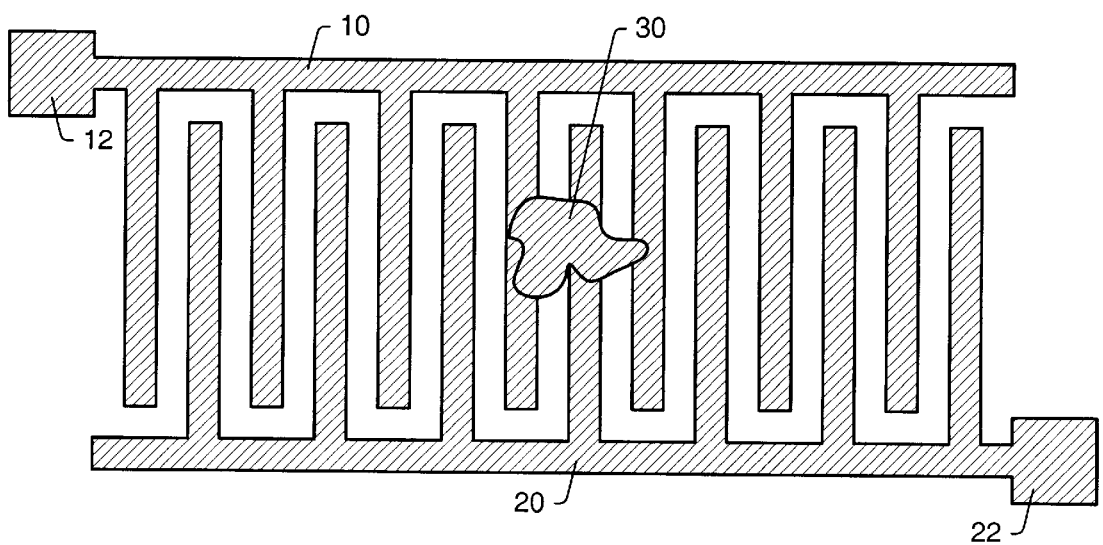
Figure 2A:
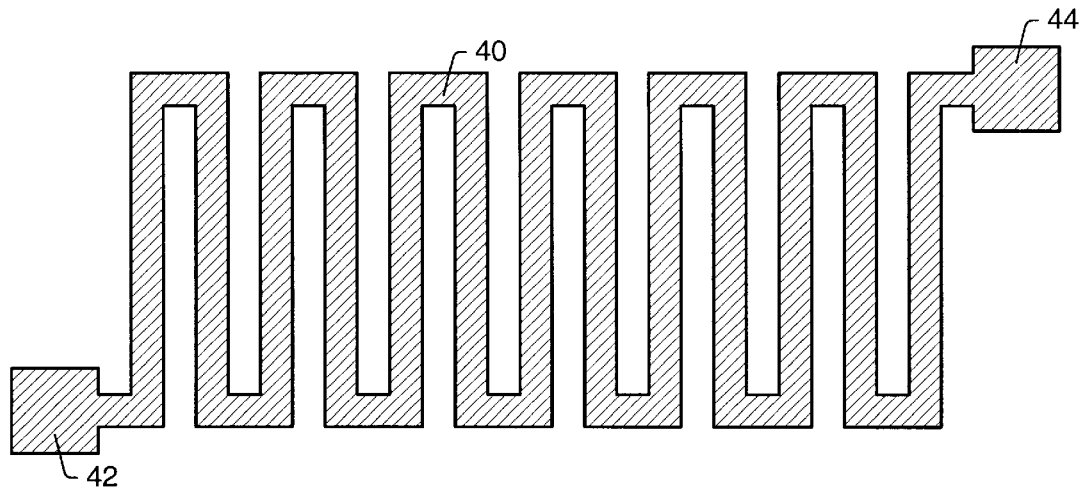
FIGS. 2A and 2B depict a top view of a prior art test structure for determining the presence of MMDs.
Figure 2B:
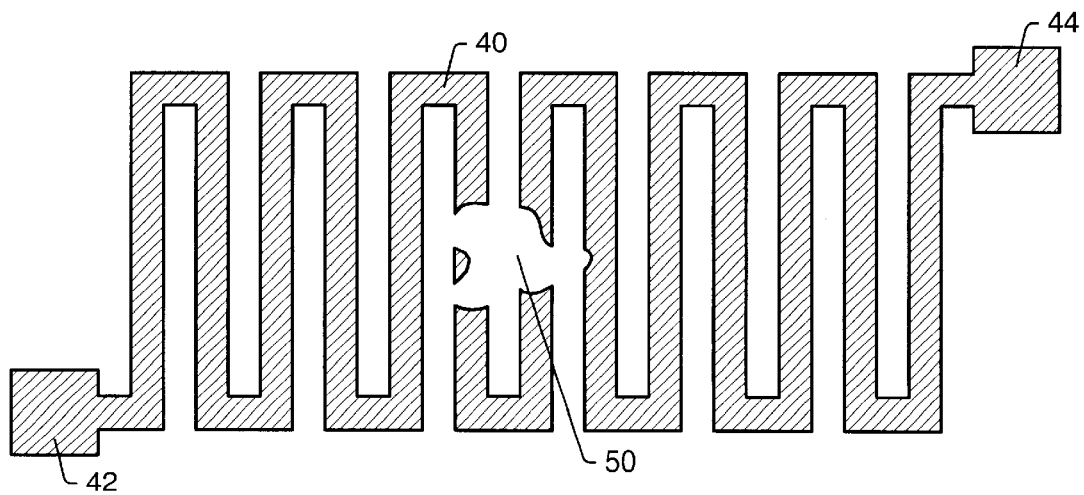

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 3:
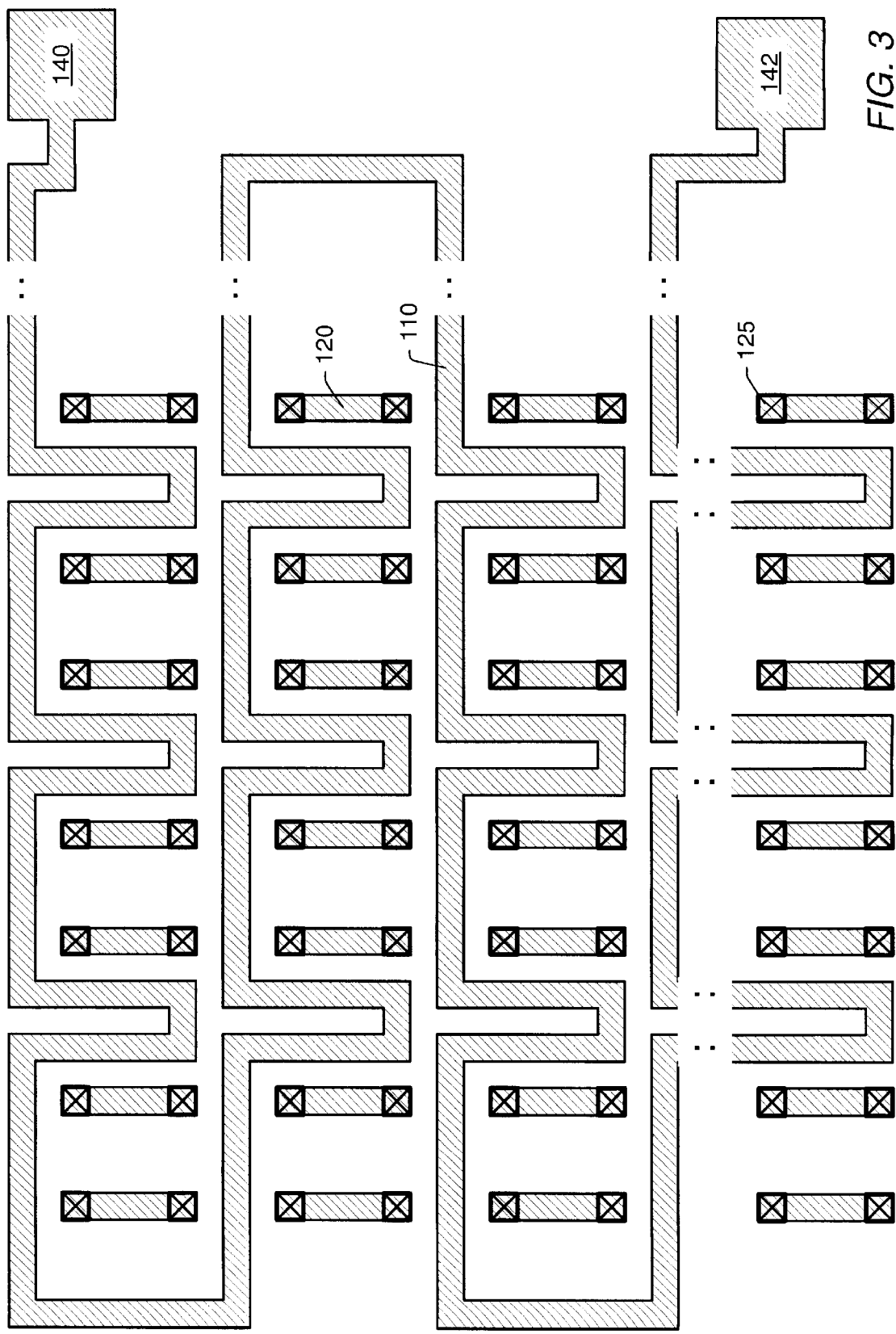
FIG. 3 depicts a top view of a first conductive feature layer of a test structure which includes a conductive line and portions of a daisy chain feature.
Figure 4:
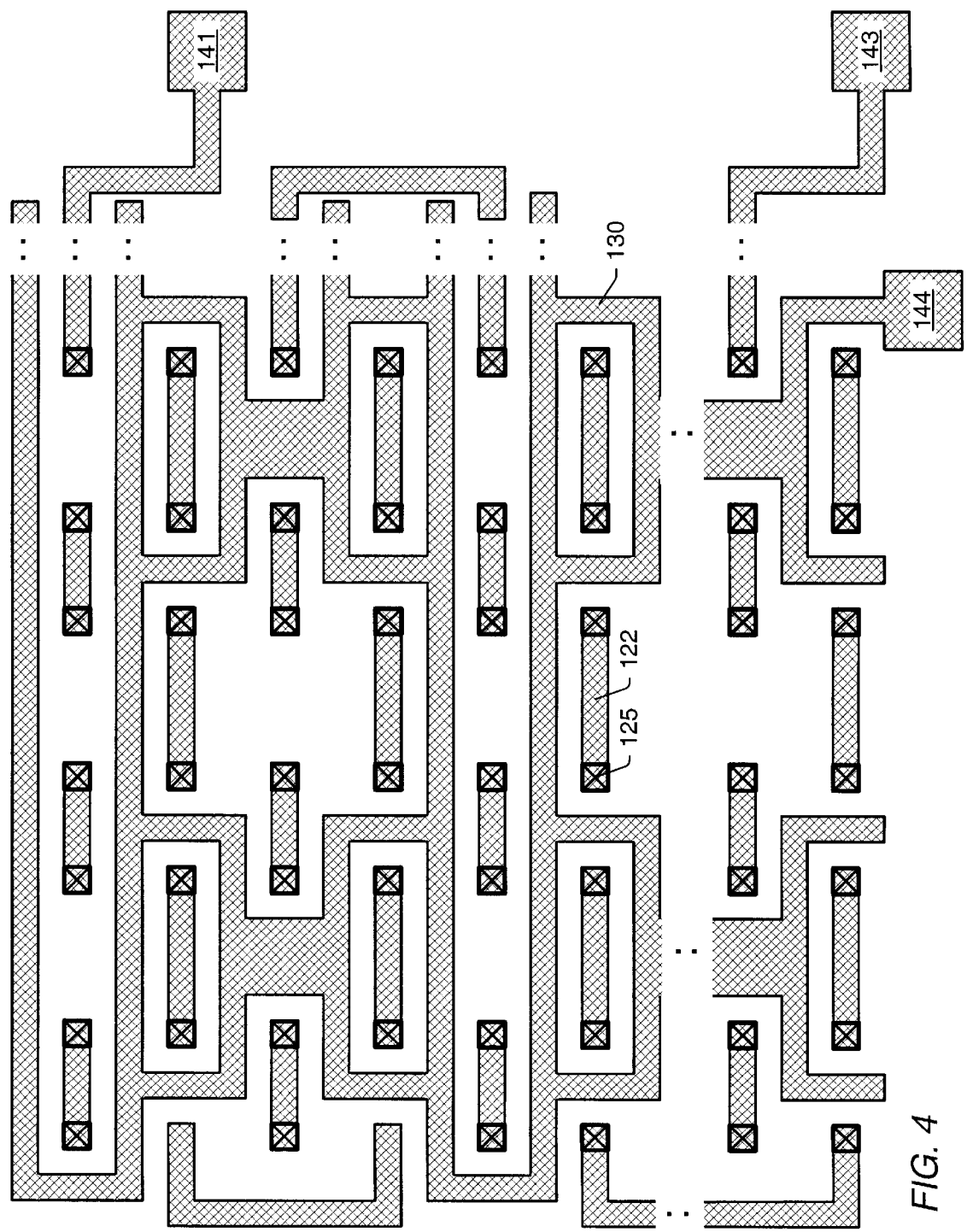
FIG. 4 depicts a top view of second conductive feature layer of a test structure which includes a conductive line and portions of a daisy chain feature.
Figure 5:
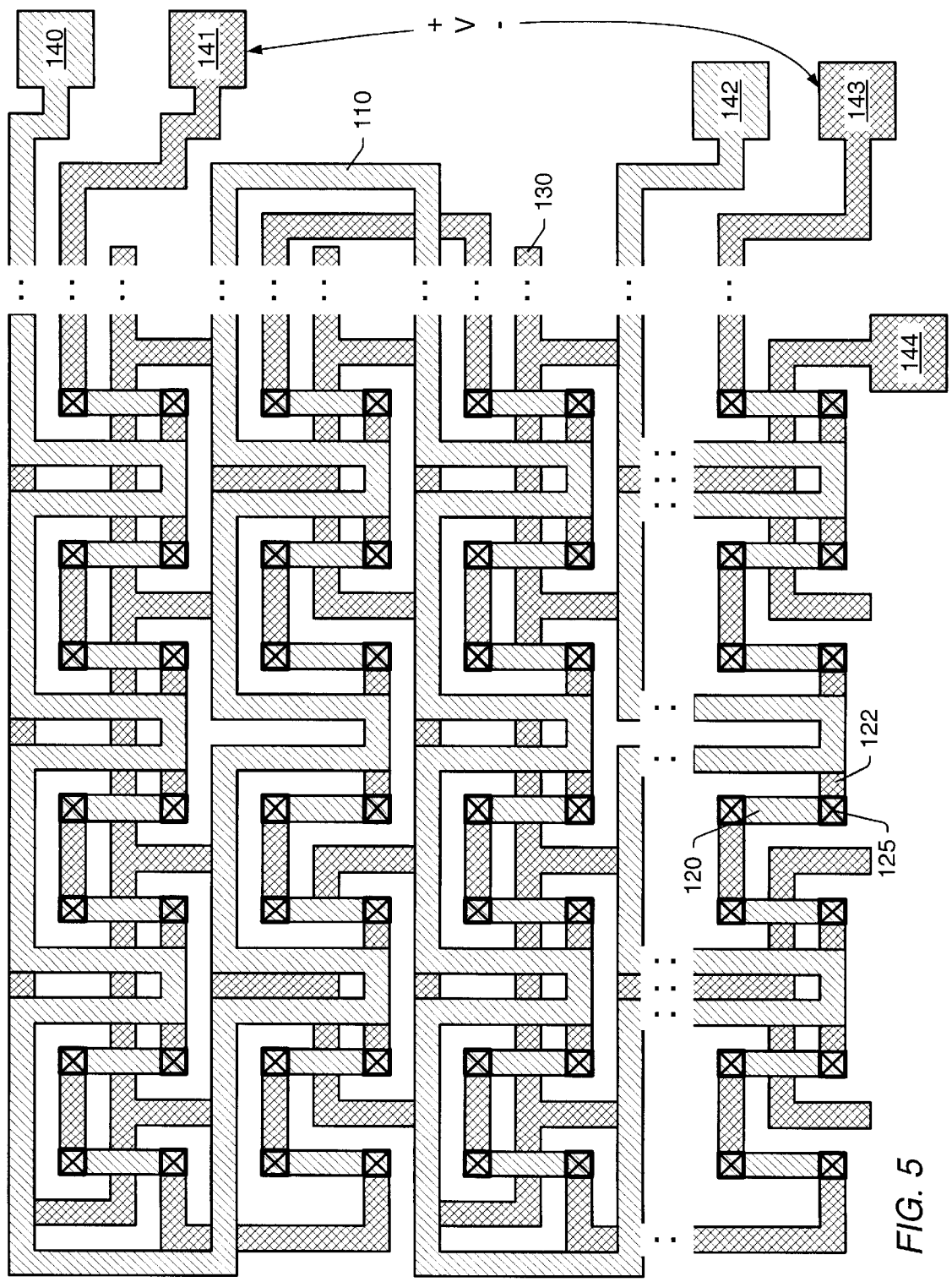
FIG. 5 depicts a top view of the first conductive feature layer overlaid on the second conductive feature layer.

An embodiment of a multi-layer test structure which includes at least a first conductive line formed at a first conductive feature layer, a second conductive line formed at a second conductive feature layer, and a daisy chain conductive line is depicted in FIGS. 3–5. FIG. 3 depicts an embodiment of the first conductive feature layer of the test structure. The first conductive layer includes a first conductive line 110. The first conductive line meanders through the first conductive layer in a serpentine fashion.

Figure 6:
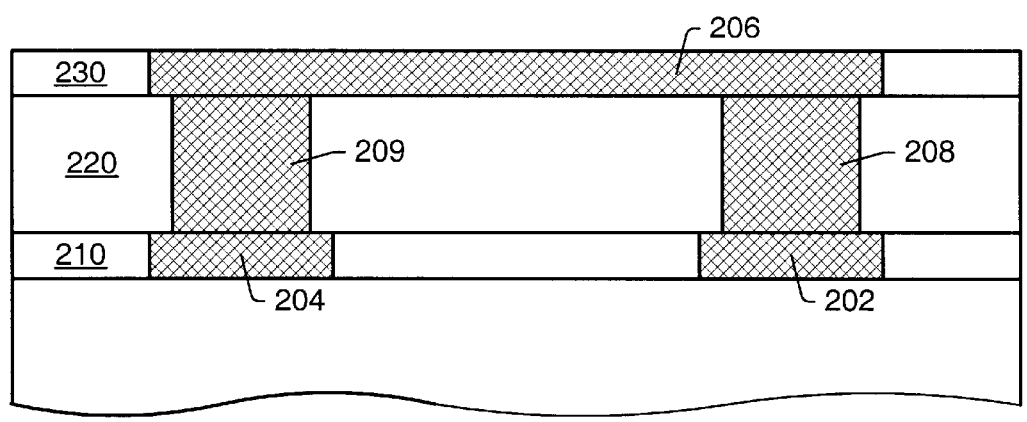
FIG. 6 depicts a cross-sectional view of a daisy chain conductive feature.

Also depicted in FIG. 3 are portions of a daisy chain conductive feature 120. A daisy chain conductive feature is herein defined as a conductive feature which includes segments of conductive features which are formed on two conductive feature layers, the individual segments being interconnect by a series of inter-level (vertical) contacts (i.e., vias) formed between the two conductive layers. FIG. 6 depicts a side via of a typical daisy chain structure. As depicted in FIG. 6, conductive lines may be formed at a first conductive feature layer 210 which is separated from a second conductive feature layer 230 by an interlevel dielectric material 220. Conductive lines 202 and 204 on the first conductive feature layer 210 may be electrically coupled to each other by the conductive line 206 in second conductive feature layer 230. Vias 208 and 209 connect the first conductive feature layer to the second conductive feature layers. In this manner, a series of isolated conductive lines may be interconnected using vias.

Turning back to FIG. 3, the portions of daisy chain conductive features 120, which are formed on the first conductive feature layer, may be interconnected to each other by contact with conductive lines formed on the second conductive feature layer. A series of vias 125 may be formed between the two conductive feature layers to complete the daisy chain line.

FIG. 4 depicts a second conductive feature layer which includes a second conductive line 130. The second conductive line 130, in one embodiment, includes a series of interconnected conductive lines extending over the test structure in a web like manner. The second conductive line 130 may include lines having a variable line width. Having some conductive lines with variable line widths may more accurately approximate actual production lines. The second conductive feature layer also includes portions 122 of the daisy chain conductive feature. These portions 122 are interconnected by vias 125 which connect to the portions 120 of the daisy chain conductive feature in the first conductive feature layer.

The widths of the conductive lines, as well as the spacing between them, may be selected to correspond to the linewidths and separation between conductive lines that are formed in production regions of a wafer. Typically, the conductive lines have the minimum linewidth and spacing that will be used during a typical semiconductor processing step. The conductive lines may be formed by a deposition/etching procedure. Conductive lines formed from a deposition/etch may be formed from a conductive metal, e.g., aluminum, titanium, or silicided polysilicon. Alternatively, the conductive lines may be formed using a damascene process in which the conductive material is electrodeposited into a predefined trench. Conductive lines formed in this manner include, e.g., copper, aluminum, tungsten or molybdenum.

FIG. 5 depicts a view in which the first conductive feature layer has been overlaid on the second conductive feature layer. It should be understood that the first and second conductive feature layers are at different elevation levels, with the second layer separated from the first layer by an intervening dielectric layer. Thus, while certain conductive lines may be depicted in FIG. 5 as intersecting, it should be understood that the lines from the first and second conductive feature levels are not intended to be electrically coupled to each other. In addition, the conductive lines from each conductive layer has been depicted with a different shading pattern, even though, in most cases, the conductive layers are formed from the same conductive material. As depicted in FIG. 5, the daisy chain feature includes a series of interconnected conductive portions of the first and second conductive feature layers. For example, daisy chain portion 120 is formed in the first conductive layer and is separated by an intervening dielectric layer from daisy chain portion 122. The two portions 120 and 122 are coupled to each other by a via 125. In this manner, the daisy chain feature extends across the test structure in a serpentine like fashion.

A number of test pads 140, 141, 142, 143, and 144 are coupled to the first conductive line, the second conductive line and the daisy chain conductive feature. These test pads may be configured to receive an electrical probe. An electrical probe may be used to apply a voltage to one or more test pads to determine the electrical connectivity of the various conductive lines of the test structure. These test pads may also be used during voltage contrast inspection techniques. For voltage contrast experiments, at least some of the lines need to be grounded. Preferably, the comb lines are grounded while the serpentine lines are ungrounded. Test pads 140 and 144, for example, may be grounded to allow voltage contrast testing.

This embodiment of a test structure may be used to test for defects which may have occurred during the formation of conductive lines on an integrated circuit topography. The test structure may be formed on a test area of an integrated circuit topography using the same process steps as used on a production die area of the wafer. In this manner, process induced defects produced in the production die areas may be duplicated in the test structure area. Examples of test methods with which the above-described test structure may be used include, but are not limited to, voltage contrast inspection, optical inspection, and basic particle size distribution testing.

In one embodiment, the test structure may be used to determine the accuracy of via formation between two conductive feature layers. For example, applying a voltage V to test pads 141 and 143 as illustrated by FIG. 5 should show a relatively low resistance if the conductive lines 120 and 122 on the first and second conductive feature layers, respectively, are properly connected by the vias 125. If a relatively high resistance is measured between pads 141 and 143, a break in the connectivity of the daisy chain may be indicated. Such breakdowns may be caused by misalignment of the vias with respect to the conductive lines on the first or second conductive feature layers. Alternatively, a high resistance value may be indicative of the improper formation of the vias or the conductive lines. An open formed in a via may break the connectivity in the daisy chain causing an increase in resistivity.

One advantage of the above described test structure is that the test structure may be used to detect a variety of potential defects. In addition to the use of the daisy chain feature to test via formation, the structure may also be used to find MMDs and EMDs. For example, applying a voltage to test pads 140 and 142 may be used to test for defects along conductive line 110. Any MMDs which are formed along conductive line 110 may cause an increase in the resistivity of the conductive line.

EMDs may also be discovered by applying a voltage to test pads which are connected to different conductive lines. Applying a voltage to test pads 144 and 143 and/or 144 and 141, for example, will allow tests for EMDs which connect the second conductive line 130 with daisy chain features 122. In this case, a relatively high resistivity should be measured between the two pads if no EMDs exist. If an EMD exists which causes a short between the two lines, a significantly reduced resistivity will be measured. It should be noted that this testing method may be used even if a defect has been found in the daisy chain conductive feature. By testing the resistivity between pads 144 and 143 and the resistivity between pads 144 and 141, both portions of the daisy chain feature may be tested individually if a defect exists along the daisy chain feature between the two pads.

Additionally, the test structure may be used to test for shorts between the conductive lines on the first and second conductive layers. For example, applying a voltage to test pads 144 and 142 or 144 and 140, EMDs coupling the first and second conductive lines 110 and 130, respectively, may be indicated by a decrease in resistance between the two lines. Such a decrease in resistivity may be indicative of a defect which occurs during the formation of the interlevel dielectric material. If, for example, the interlevel dielectric material is too thin or damaged, the resistivity between the two lines may decrease. It should be noted that this testing method may be used even if a defect has been found along the first conductive line. By testing the resistivity between pads 144 and 142 and the resistivity between pads 144 and 140, both portions of the first conductive line may be tested individually if a defect exists along the first conductive line between the two pads.

Figure 7:
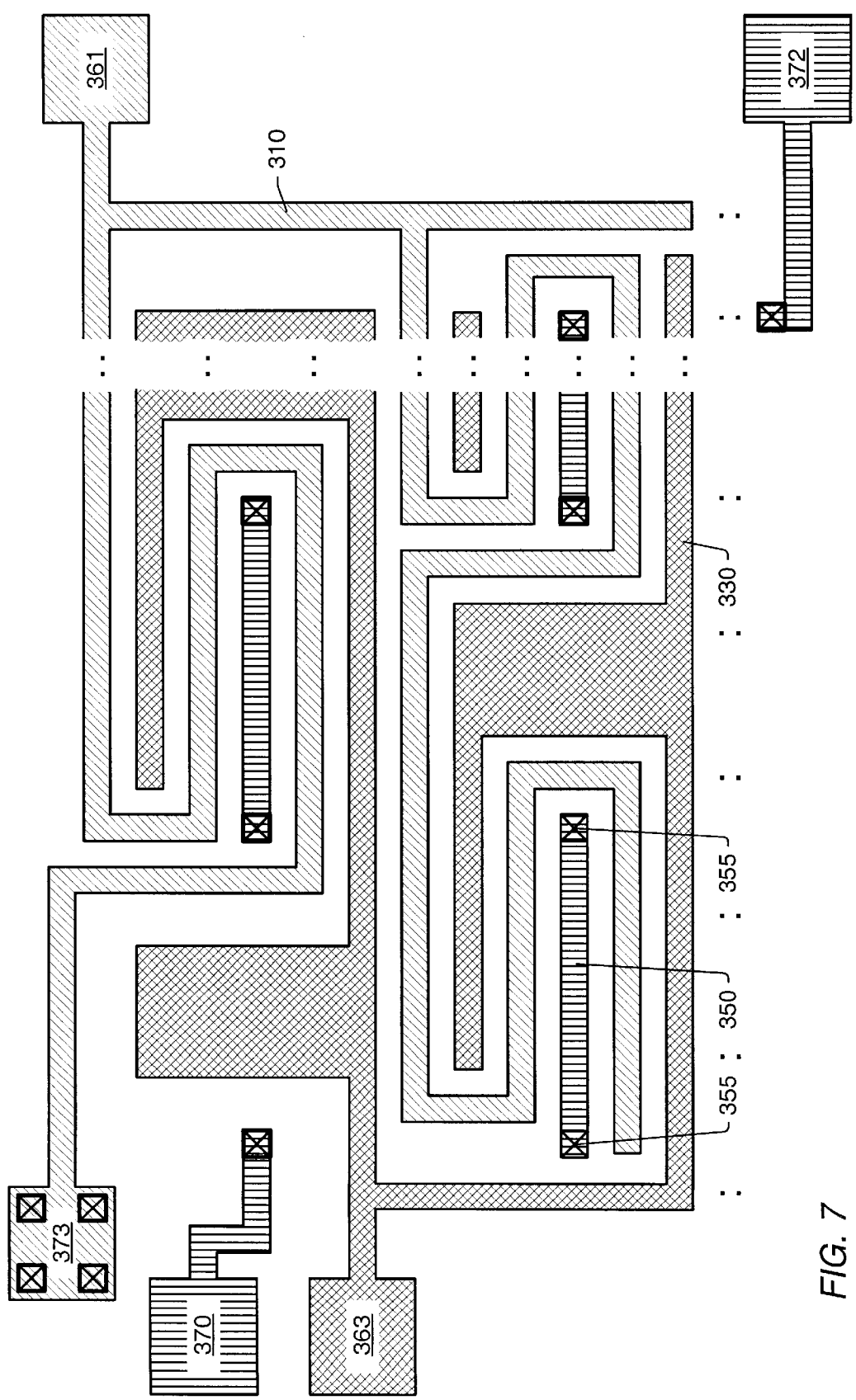
FIG. 7 depicts a top view of a first conductive feature layer of a test structure which includes two conductive lines and portions of a daisy chain feature.
Figure 8:
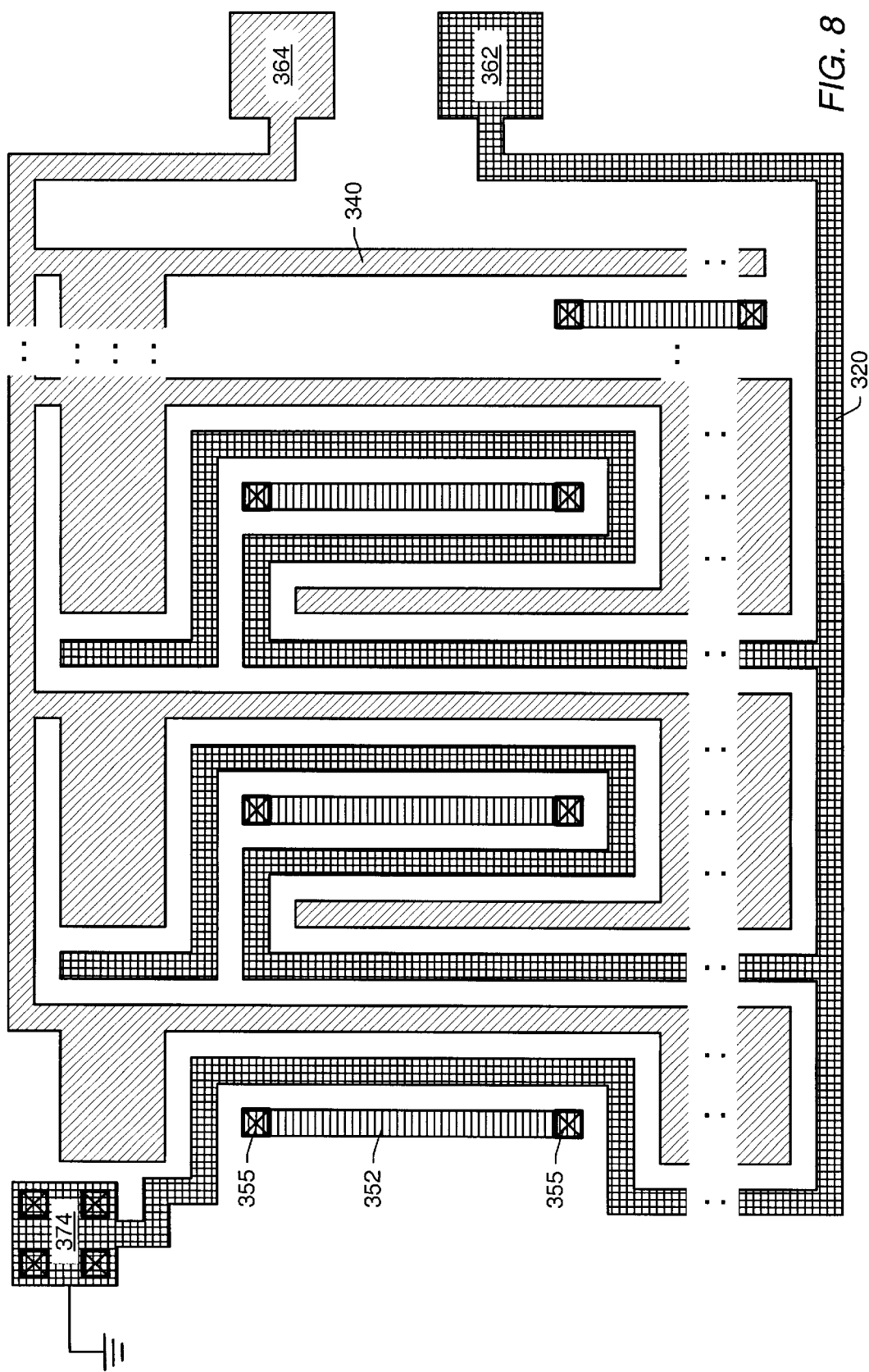
FIG. 8 depicts a top view of second conductive feature layer of a test structure which includes two conductive lines and portions of a daisy chain feature.
Figure 9:
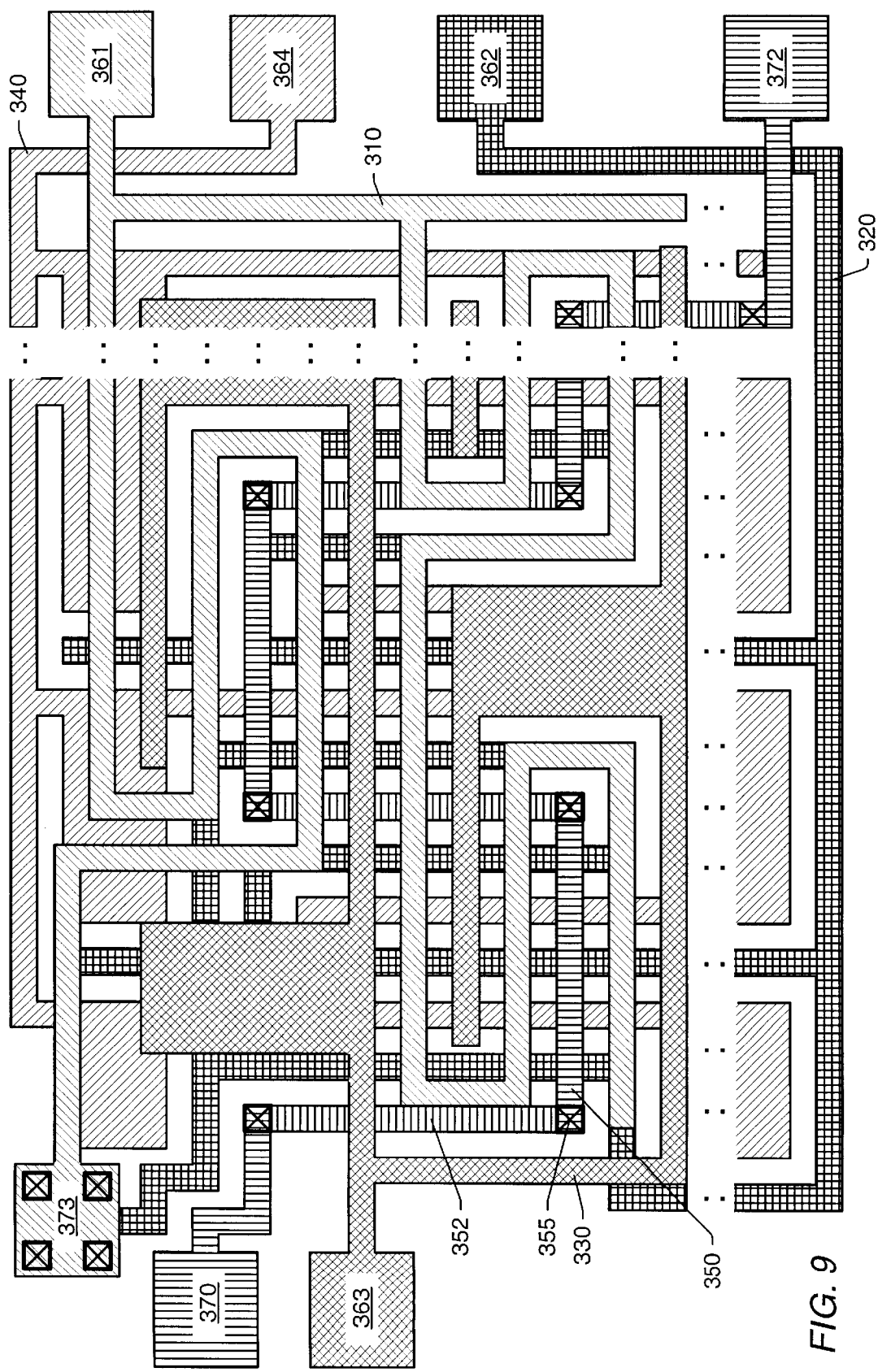
FIG. 9 depicts a top view of the first conductive feature layer of FIG. 7 overlaid on the second conductive feature layer of FIG. 8.

Another embodiment of a multi-layer test structure which includes a first and third conductive line formed in a first conductive feature layer, a second and fourth conductive line formed in a second conductive feature layer, and a daisy chain conductive feature formed in both the first and second conductive feature layers is depicted in FIGS. 7–9. FIG. 7 depicts an embodiment of the first conductive feature layer of the test structure. The first conductive feature layer includes the first conductive line 310 and the third conductive line 330. The first conductive line 310 meanders through the first conductive layer in a serpentine fashion. The third conductive line 330 also meanders through the first conductive layer in a serpentine fashion, intertwined between the first conductive line 310.

Also depicted in FIG. 7 are portions of a daisy chain conductive feature 350. The portions of daisy chain conductive features 350, which are formed on the first conductive feature layer, may be interconnected to each other by contact with conductive features formed on the second conductive feature layer. A series of vias 355 may be formed between the two conductive feature layers to complete the daisy chain line.

FIG. 8 depicts a second conductive feature layer which includes the second conductive line 320 and the fourth conductive line 340. The second conductive line 320 and fourth conductive line 340 meander through the second conductive feature layer in a manner similar to the first and third conductive lines 310 and 330, respectively. The second conductive line 320 and the fourth conductive line 340 may include lines having a variable line width. Having some conductive lines with variable line widths may more accurately approximate actual production lines. The second conductive feature layer also includes portions 352 of the daisy chain conductive feature. These portions 352 are interconnected by vias 355 which connect to the portions 352 of the daisy chain conductive feature in the first conductive feature layer.

The conductive lines may be formed by a deposition/etching procedure. Conductive line formed from a deposition/etch may be formed from a conductive metal, e.g., aluminum, titanium, or silicided polysilicon. Alternatively, the conductive lines may be formed using a damascene process in which the conductive material is electrodeposited into a predefined trench. Conductive lines formed in this manner include e.g., copper, aluminum, tungsten or molybdenum.

FIG. 9 depicts a view in which the first conductive feature layer has been overlaid on the second conductive feature layer. It should be understood that the first and second conductive feature layers are at different elevation levels, with the second layer separated from the first layer by an intervening dielectric layer. Thus, while certain conductive lines may be depicted in FIG. 9 as intersecting, it should be understood that the lines from the first and second conductive feature layers are not intended to be electrically coupled to each other. In addition, the conductive lines from each conductive layer has been depicted with a different shading pattern, even though, in most cases, the conductive layers may be formed from the same conductive material.

As depicted in FIG. 9, the daisy chain feature includes a series of interconnected conductive portions of the first and second conductive feature layers. For example, daisy chain portion 350 is formed in the first conductive layer and is separated by an intervening dielectric layer from daisy chain portion 352. The two portions 350 and 352 are coupled to each other by a via 355. In this manner, the daisy chain feature extends across the test structure in a serpentine like fashion.

A number of test pads 361, 362, 363, 364, 370, and 372 are coupled to the first, second, third, fourth and daisy chain conductive features. These test pads are configured to receive an electrical probe. An electrical probe may be used to apply a voltage to one or more test pads to determine the electrical connectivity of the various conductive lines of the test structure.

These test pads may also be used during voltage contrast inspection techniques. Test pads 373 and 374 are, in one embodiment, grounded to a sub-layer (not shown). The test pads 373 and 374 are interconnected by vias formed between each of the test pads. The bottom test pad, in the depicted example test pad 374, is typically coupled to a grounded sub-layer. This grounded sub-layer is formed during a processing sequence prior to the formation of the interconnect lines. The sub-layer, in one embodiment, may be coupled to the backside of the semiconductor substrate to a grounding contact located on the backside of the wafer.

Figure 12:
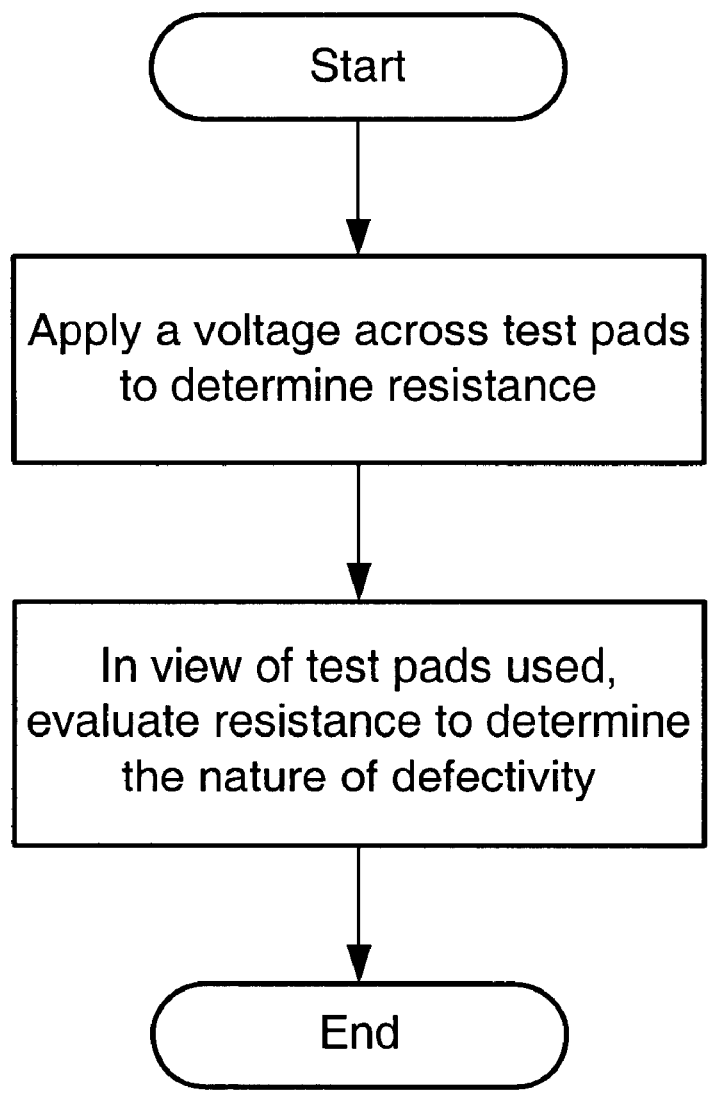
FIG. 12 depicts a flow chart for using the test structure.

FIG. 12 depicts a flow-chart for using the test structure. In one embodiment, the test structure may be used to determine the integrity of via formation between two conductive feature layers. For example, applying a voltage to test pads 370 and 372 should show a relatively low resistance if the conductive lines 350 and 352 on the first and second conductive feature layers, respectively, are properly connected by the vias 355. If a relatively high resistance is measured between pads 370 and 372, a break in the connectivity of the daisy chain may be indicated. Such breakdowns may be caused by misalignment of the vias with respect to the conductive lines on the first or second conductive feature layers. Alternatively, a high resistance value may be indicative of the improper formation of the vias or the conductive lines. An open formed in a via may break the connectivity in the daisy chain causing an increase in resistivity.

A variety of EMDs may also be discovered by applying a voltage to test pads which are connected to different conductive lines. Table 1 summarizes the types of EMDs which may be detected by applying a voltage to various combinations of testing pads.

| Testing Pads | Defect Detected |
|---|---|
| 361 and 363 | Short between first and third conductive lines, horizontal |
| 361 and 364 | Short between first and fourth conductive lines, vertical |
| 361 and 370 | Short between first conductive line and daisy chain, |
| 361 and 372 | horizontal upper layer |
| 362 and 363 | Short between second and third conductive lines, vertical |
| 362 and 364 | Short between second and fourth conductive lines, horizontal |
| 362 and 370 | Short between second conductive line and daisy chain, |
| 362 and 372 | horizontal lower level |
| 363 and 364 | Short between third and fourth conductive lines, vertical |
| 363 and 370 | Short between third conductive line and daisy chain, |
| 363 and 372 | horizontal upper layer |
| 364 and 370 | Short between fourth conductive line and daisy chain, |
| 364 and 372 | horizontal lower level |
| 370 and 372 | Missing material defects along the daisy chain |

It should be noted that the testing between the daisy chain and any of the other conductive lines may be used even if a defect has been found in the daisy chain conductive feature. By testing the resistivity between pads 370 or 372 and the conductive line pad, both portions of the daisy chain feature may be tested individually if a defect exists along the daisy chain feature between the two pads.

Both of the tests structures depicted in either FIGS. 4–6 or FIGS. 7–9 are particularly adapted for use in damascene conductive line processing. The test structure of FIGS. 4–6 includes a single comb line (line 130) around which multiple serpentine lines are formed. On of the serpentines being a daisy chain line 120–122. The test structure of FIGS. 7–9 differs from the structure of FIGS. 4–6 by using a single serpentine line, around which multiple comb structures are formed. Each of these test structures may be formed having different widths and spacings for defect size testing. Additionally, the test structures are typically formed using damascene process which push the photoresist and CMP polishing to their limits while still evaluating a product-like pattern possibility.

The test structure depicted in FIGS. 7–9 may also be used, in some instances, to approximate the defect size. If an EMD is detected between the daisy chain feature and any of the conductive lines, the test structure may be used to electrically determine the size of the defect. A short discovered between the daisy chain and the first or third conductive lines will be indicate that the defect is formed on the first conductive layer. A short which is found between the daisy chain and the second or fourth conductive lines may indicate that the defect is formed on the second conductive feature layer.

Figure 10A:
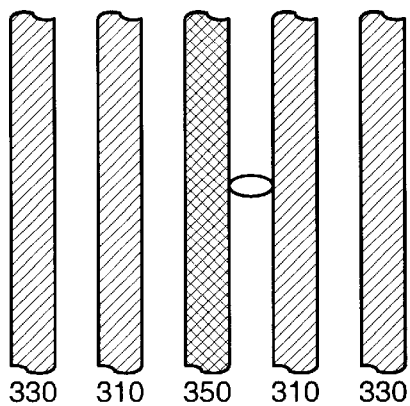
FIGS. 10A and 10B depict a top view of a test structure layout with an EMD causing a short between two adjacent conductive lines.
Figure 10B:
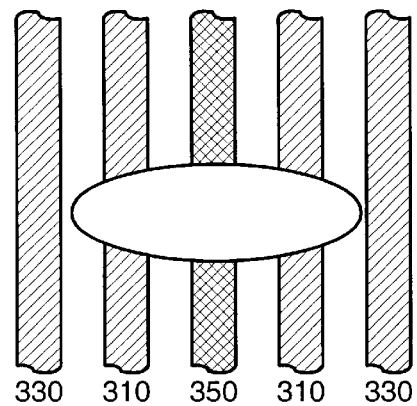

FIG. 10 depicts an enlarged view of a portion of the first conductive feature layer in which the conductive lines are substantially equal in width. In one embodiment, a short between portion 350 of the daisy chain and the first conductive line 310 may be detected during the routine testing of the test structure. In the case depicted in FIGS. 10A and 10B a short is electrically detected between adjacent conductive lines, i.e., daisy chain portion 350 and first conductive line 310. Further electrical testing will reveal that no shorts occur between the other conductive lines, i.e., first conductive line 310 and third conductive line 330. Assuming the defect is roughly circular, the minimum possible length of a defect which causes a short between adjacent conductive lines is depicted in FIG. 10A. The defect extends from an outer surface of conductive line 310 to an outer surface of daisy chain portion 350. The minimum possible length may be represented by the formula: $L_{min} \cong S_{1D}$, where $S_{1D}$, is the distance between first conductive line 310 and daisy chain portion 350. The maximum possible length of a defect, assuming the defect is roughly circular, which causes a short between adjacent conductive lines only, is depicted in FIG. 10B. The defect extends to a position which is just short of the third conductive line, spanning the first conductive line 310 and daisy chain portion 350.

The maximum possible length may be represented by the formula: $L_{max} \cong S_{13} + W_1 + S_{1D} + W_D + S_{1D} + W_1 + S_{13}$ or $L_{max} \cong 2S_{13} + 2W_1 + 2S_{1D} + W_D$, Where $S_{13}$ is the distance between conductive line 310 and 330, $W_1$ is the width of conductive line 310, $S_{1D}$ is the distance between conductive line 310 and daisy chain portion 350, and $W_D$ is the width of the daisy chain portion 350. Typically, the space between any two lines is equal to the width of any of the lines. Thus if $S_{23} = W_2 = S_{12} = W_1$, then the maximum possible length may be represented by the formula: $L_{max} \cong 7S$ (or 7W), where S is the spacing between any adjacent conductive lines and W is the width of any conductive line. Thus, if the line widths are about 0.25 μm and the spacing between the lines is about 0.25 μm, then $L_{min} \cong 0.25$ μm and $L_{max} \cong 1.75$ μm.

Figure 11:
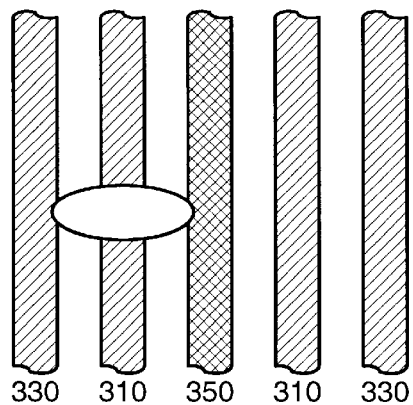
FIG. 11 depicts a top view of a test structure layout with an EMD causing a short between three adjacent conductive lines.

FIG. 11 depicts a situation where a defect causes a short between all of the conductive lines on a conductive layer. In the case depicted in FIG. 11, a short is electrically detected between all of the conductive lines. Thus, electrical testing of daisy chain portion 350 and conductive line 310 and conductive line 310 and conductive line 330 should reveal an electrical connectivity between all of the lines.

Assuming the defect is roughly circular, the minimum possible length of a defect which causes a short between all of the conductive lines is depicted in FIG. 11. The defect extends from an outer surface of conductive line 330 to an outer surface of daisy chain portion 350. The minimum possible length may be represented by the formula: $L_{min} \cong S_{1D} + W_1 + S_{13}$, where $S_{1D}$ is the distance between daisy chain portion 350 and conductive line 310, $W_1$ is the width of the conductive line 310, and $S_{13}$ is the distance between conductive line 310 and conductive line 330. If the spacing between the lines is equal to the width of the conductive lines, the formulas for $L_{min}$ may be simplified to: $L_{min} \cong 3S$ (or 3W), where S is the spacing between any adjacent conductive lines and W is the width of any conductive line. Thus, if the line widths are about 0.25 μm and the spacing between the lines is about 0.25 μm, then $L_{min} \cong 0.75$ μm.

The spacing and line widths of the conductive lines of the test structure may be varied to allow a greater range of defect sizes to be determined. By reducing the line width and/or the spacing of the conductive lines, narrow defect size ranges may be detected. Alternatively, the width and spacing of the conductive lines may be increased such that a broad range of defect sizes may be determined. The spacing between the conductive lines, as well as the width of the conductive lines, need not be the same for each conductive line. By customizing the test structure in this manner, information about the defect size may be readily obtainable. It should also be noted that an analogous sizing procedure may be applied to defects found in the second conductive feature layer.

It will be appreciated to those skilled in the art having the benefit of this disclosure that both the test structure and the method for using a test structure described herein are capable of applications with numerous types of conductive lines formed on an integrated circuit topography. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A test structure comprising:
    a first conductive line formed at a first conductive feature layer of an integrated circuit topography;
    a second conductive line formed at a second conductive feature layer of the integrated circuit topography; and
    a daisy chain conductive feature, comprising first conductive line segments formed at the first conductive feature layer and second conductive line segments formed at the second conductive feature layer, wherein the first conductive line segments and the second conductive line segments are interconnected by vias formed vertically through a dielectric layer separating the first conductive feature layer from the second conductive feature layer;
    wherein the first conductive line, the second conductive line and the daisy chain conductive feature are electrically isolated from each other in the absence of a defect.

2. The test structure of claim 1, wherein the first conductive line, the second conductive line and the daisy chain conductive feature comprise an electrodeposited metal.

3. The test structure of claim 1, further comprising pads coupled to the first conductive line, the second conductive line and the daisy chain conductive feature, wherein the pads are configured to receive an electrical testing probe.

4. The test structure of claim 1, wherein the test structure is configured to allow testing to identify a variety of defects associated with production of the integrated circuit topography.

5. The test structure of claim 1, wherein a space between the first conductive line and a daisy chain conductive feature is adapted such that the space could be bridged by defects having a length equivalent to the space.

6. The test structure of claim 1, wherein a width of the first conductive line is substantially equivalent to a width of the second conductive line, wherein widths of the daisy chain first and second conductive line segments are substantially equivalent to the widths of the first and second conductive lines, and wherein lateral spaces between the conductive lines and the daisy chain conductive line segments have widths that are substantially equivalent to the widths of the first and second conductive lines.

7. The test structure of claim 1, further comprising a third conductive feature formed at the first conductive feature layer and a fourth conductive feature formed at the second conductive feature layer.

8. The test structure of claim 7, wherein the first and third conductive features are intertwined such that a distance between the first and third conductive features is substantially constant, and wherein the second and fourth conductive features are intertwined such that a distance between the second and fourth conductive features is substantially constant.

9. The test structure of claim 7, further comprising testing pads coupled to the first, second, third and fourth conductive lines.

10. A method for detecting defects produced during the formation of an integrated circuit, comprising:
    forming a first conductive line on a first conductive feature layer;
    forming a second conductive line on a second conductive feature layer, where the first and second feature layers are separated by a dielectric;
    forming a daisy chain conductive feature including first line segments within the first conductive feature layer and second line segments within the second conductive feature layer, where the first and second line segments are interconnected by vias extending through the dielectric; and
    determining an electrical resistance between first and second test pads among a plurality of test pads coupled to the first conductive line, the second conductive line and the daisy chain feature.

11. The method of claim 10, wherein said determining the electrical resistance comprises applying a voltage to the ends of the daisy chain conductive feature.

12. The method of claim 10, wherein said determining the electrical resistance comprises applying a voltage to testing pads coupled to the first conductive line.

13. The method of claim 10, wherein said determining the electrical resistance comprises applying a voltage across test pads coupled to the second conductive line feature and the daisy chain feature, respectively.

14. The method of claim 10, wherein said determining the electrical resistance comprises applying a voltage across test pads coupled to the first conductive line and the second conductive line, respectively.

15. The method of claim 10, further comprising visually inspecting the first conductive line, second conductive line, or daisy chain conductive feature.

16. The method of claim 10, further comprising inspecting the first conductive line, second conductive line, or daisy chain conductive feature using voltage contrast.

17. The method of claim 10, wherein said determining comprises observing a high resistance between first and second test pads coupled to the daisy chain feature, and further comprising noting a possible via formation defect.

18. The method of claim 10, wherein said determining comprises observing a low resistance between first and second test pads coupled to the first conductive line and the second conductive line, respectively, and further comprising noting an extra material defect coupling the first and second conductive lines together.

19. The method of claim 10, further comprising forming a third conductive line on the first conductive feature layer and a fourth conductive line on the second conductive feature layer.

20. The method of claim 19, wherein said determining the electrical resistance comprises measuring the resistance between the first and third conductive lines and measuring the resistance between the second and fourth conductive lines.

21. The method of claim 19, further comprising determining the size of an extra material defect, wherein the defect is formed at the first conductive layer, and wherein determining the size of the defect comprises measuring the resistance between the first and third conductive lines and measuring the resistance between the first conductive line and the daisy chain conductive feature.

22. A test structure for detecting the presence of defects in conductive features formed on an integrated circuit topography comprising a planar serpentine conductive line and a daisy chain conductive feature, wherein the daisy chain conductive feature extends partially coplanar with and laterally from the serpentine conductive line and partially on a plane above or below a plane of the first serpentine line.

* * * * *